United States Patent
Tseng

(10) Patent No.: US 6,429,110 B1
(45) Date of Patent: Aug. 6, 2002

(54) MOSFET WITH BOTH ELEVATED SOURCE-DRAIN AND METAL GATE AND FABRICATING METHOD

(75) Inventor: Horng-Huei Tseng, Hsin-Chu (TW)

(73) Assignee: Vanguard International Semiconductor Corporation (TW)

( * ) Notice: Subject to any disclaimer, the term of this patent is extended or adjusted under 35 U.S.C. 154(b) by 0 days.

(21) Appl. No.: 09/729,163

(22) Filed: Dec. 5, 2000

(51) Int. Cl.⁷ .......................................... H01L 21/4763
(52) U.S. Cl. ...................... 438/592; 438/300; 438/585; 438/588
(58) Field of Search ................................ 438/300–585, 438/588, 592; 257/750, 754, 755, 758, 763, 765

(56) References Cited

U.S. PATENT DOCUMENTS

| | | | | |
|---|---|---|---|---|
| 5,861,340 A | * | 1/1999 | Bai et al. | 438/592 |
| 6,169,017 B1 | * | 1/2001 | Lee | 438/585 |
| 6,251,760 B1 | * | 6/2001 | Son | 438/585 |
| 6,258,682 B1 | * | 7/2001 | Tseng | 438/305 |
| 2002/0006715 A1 | * | 1/2002 | Chhagan et al. | 438/585 |

* cited by examiner

Primary Examiner—Long Pham
Assistant Examiner—Khiem Nguyen

(57) ABSTRACT

A method of forming a transistor and a semiconductor-metal-oxide transistor. The method at least includes provides a substrate; covers the substrate by a doped amorphous polysilicon layer and a barrier layer in sequence, and removes part of the barrier layer and part of the doped amorphous polysilicon layer to form a hole which expose part of the substrate; forms a dielectric layer on both the barrier layer and the hole, wherein the hole is not totally filled by the dielectric layer; forms a conductor layer on the dielectric layer, wherein the hole is not totally filled by both the conductor layer and the dielectric layer; forms a metal layer on the conductor layer; performs a planarizing process by using the barrier layer as a stop layer; and removing the barrier layer. The other at least includes a U-shaped dielectric layer which is located on a substrate; a U-shaped polysilicon layer which is located on the hollow of the U-shaped dielectric layer; a metal layer which is located on the hollow of the U-shaped polysilicon layer; a source doped region which is located in the substrate and is briefly located on one side of the U-shaped dielectric layer; a drain doped region which is located in the substrate and is briefly located on another side of the U-shaped dielectric layer; and an epi-like silicon layer which is located on both the source doped region and the drain doped region.

13 Claims, 6 Drawing Sheets

MOSFET WITH BOTH ELEVATED SOURCE-DRAIN AND METAL GATE AND FABRICATING METHOD

BACKGROUND OF THE INVENTION

1. Field of the Invention

The invention pertains to transistor, and particular to method for forming transistor with both elevated source-drain and metal gate.

2. Description of the Prior Art

One trend of the semiconductor industry is to make semiconductor devices as small as possible. However, process technology or methods used in forming such devices impose limitations on how small a device can be made.

A typical semiconductor device and a primary building block in the semiconductor industry is the transistor, especially the metal oxide semiconductor field effect transistor (MOSFET). Referring to FIG. 1, a MOSFET is typically composed of gate conductor layer 120, sidewall 116 and gate dielectric layer 115 which both are formed over substrate 110, herein gate conductor layer 120 is usually composed of polysilicon and gate dielectric layer 115 is usually composed of oxide. Within substrate 110 are formed deep source-drain regions 150 (sometimes referred to as heavily doped source and drain regions) and source-drain extension regions 130 (sometimes referred to as lightly doped source-drain region). In general, doped regions are regions contain a higher concentration of P-type or N-type dopants than substrate 110. Source-drain extension regions 130 generally have a lower concentration of dopants compared to deep source-drain regions 150, although sometimes these regions can be doped at equivalent levels. Further, source-drain extension regions 130 have a thickness, which is smaller than thickness of deep source-drain regions 150. Shallow source-drain extension regions 130 are important for reducing hot carrier injection (HCI), which often occurs in scaled down (e.g. sub-micron) devices, and for maintaining other device characteristics such as threshold voltage rolloff, punchthrough, and other short channel characteristics. Thicker deep source-drain regions 150 are generally important for lowering device resistivity, for maxing device current and for forming contact.

In reducing the size of MOSFET devices, much of the focus has been on reducing the length of gate conductor 120. As the length is reduced, however, the device size must also be reduced in the vertical direction. That is to say that thickness of source-drain extension regions 130 also must be reduced. However, formation of shallow source-drain extension regions 130 requires precise control of dopant distribution on a fine scale. Unfortunately, while technology will allow other portions of MOSFET devices to be scaled smaller, e.g. gates scaled in sub-micron lengths, limitations in forming finely scaled source-drain extension regions 130 have prevented semi-conductor devices from reaching their smallest dimensions. These limitations often arise as a result of heat steps, including annealing process for repairing and achieving doped regions, but also causing diffusion of dopants.

One proposed structure which allows for small device scaling while avoiding small scale source-drain extension formation problems is the elevated source-drain MOSFET, which also is called as elevated source-drain MOSFET. One type of elevated source-drain MOSFET is the hot-carrier suppressed (HCS) MOSFET, a cross-section of which is shown in FIG. 2, that includes substrate 210, gate dielectric 215, gate conductor 220 and sidewall 270. Besides, HCS MOSFET also has source and drain region 240 in substrate 210.

Rather than using source-drain extension regions, the HCS MOSFET has elevated layers 250 which perform the same functions as source-drain extension regions in conventional MOSFETs but avoid the dopants diffusion problem in their formation. That is, layers 250 reduce, or suppress, hot-carrier injection. Further, in order to provide lower sheet and contact resistance, additional layers 260 are utilized. Herein, doping concentration of additional layers 260 is higher than that of elevated layers 250. Besides, because many of the functions of the deep source-drain regions of conventional MOSFETs are fulfilled by the additional layer 260, HCS MOSFET source and drain regions 240 can be remain shallow, which is desirable in forming smaller devices. More detailed information regarding the general structure and performance of HCS MOSFETs devices can be found in Shin et al., "MOSFET Drain Engineering Analysis for Deep-Submicrometer Dimensions: A New Structural Approach", IEEE Transactions on Electron Devices, Vol. 39, No. 8 (August 1992).

While elevated source-drain MOSFETs have comparable performance characteristics to those of conventional MOSFETs while at the same time permitting the formation of smaller devices when compared with conventional MOSFETs, use of elevated source-drain MOSFETs has not become widespread. The devices are difficult to manufacture for al least following reasons. First, as shown in FIG. 2, elevated layers 250 and second layers 260 must be selectively grown, which is a difficult task involving high vacuum and chemical vapor deposition processes. Such processes further requires expensive equipment, are difficult to control, critically rely on surface preparation, and are cagily ruined by a small amount of contamination.

Second, source and drain regions 240 are doped using conventional methods, e.g. ion implantation, prior to forming elevated layers 250 and second layers 260. For the same reasons that source-drain extension regions depth in a conventional MOSFET is difficult to control, so too is it difficulty to maintain shallow source and drain regions 240, which are desirable in forming small scale elevated source-drain MOSFETs. Further, the heat cycles in both elevated layers 250 and second layers 260 formation cause the dopants to diffuse.

Third, qualify of sidewall 270 in these elevated source-drain MOSFETs is generally lacking. Sidewalls of sufficient uniform thickness are necessary to control capacitance between gate the raise source-drain regions (layers 250 and 260). Such sidewall 270, however, are general grown or deposited on the gate prior to forming layers 260/260, and the ability to form sidewalls of adequate uniform thickness to sufficiently control capacitance is extremely difficult (for example, shape of deposited sidewall 270 is fan-shape), particularly when subjected to the forming process of both layers 260/260.

Moreover, although polycide has been widespreadly used to reduce the resistance between the gate of MOSFET and corresponding conductor line(s), because that polycide usually is a composite of polycide layer which is closed to dielectric layer (also called as gate oxide layer) and metal layer which is far away dielectric layer, following disadvantages are unavoidable: thermal processes of fabrication of polycide will induce diffusion of doped dopants, metal is difficult to be etched (for example, copper) and polysilicon and metal must be etched separately. Thus, while gate conductor 220 is made of polycide (means metal gate is formed), although resistance between gate of MOSFET and corresponding conductor line(s) is reduced, shape of source and drain region 240 is varied and enlarged, and also total fabrication of MOSFET is further complicated by application of polycide.

Therefore, it is desirable to develop a process that will allow for easier manufacturabiliy of elevated source-drain MOSFETs, and thus allow for semiconductor device formation of reduced size.

SUMMARY OF THE INVENTION

Objects of the present invention at least include method(s) for forming a MOSFET with both elevated source-drain and metal gate, especially for method(s) the effectively avoid disadvantages of conventional fabrication of elevated source-drain MOSFET.

Objects of the present invention further comprise integrating forming processes of metal gate and elevated source-drain during fabrication of MOSFET.

Still an object of the invention is to present a new structure of the MOSFET that at least includes elevated source-drain and metal gate at the same time.

On the hole, one embodiment is a method of forming a transistor. The method at least includes provides a substrate; covers the substrate by a doped amorphous polysilicon layer and a barrier layer in sequence, and removes part of the barrier layer and part of the doped amorphous polysilicon layer to form a hole which expose part of the substrate; forms a dielectric layer on both the barrier layer and the hole, wherein the hole is not totally filled by the dielectric layer; forms a conductor layer on both the dielectric layer and the hole, wherein the hole is not totally filled by both the conductor layer and the dielectric layer; forms a metal layer on the conductor layer; performs a planarizing process by using the barrier layer as a stop layer; and removing the barrier layer.

Another embodiment is a transistor that at least includes a U-shaped dielectric layer which is located on a substrate; a U-shaped polysilicon layer which is located on the hollow of the U-shaped dielectric layer; a metal layer which is located on the hollow of the U-shaped polysilicon layer; a source doped region which is located in the substrate and is briefly located on one side of the U-shaped dielectric layer; a drain doped region which is located in the substrate and is briefly located on another side of the U-shaped dielectric layer; and an epi-like silicon layer which is located on both the source doped region and the drain doped region.

BRIEF DESCRIPTION OF THE DRAWINGS

Preferred embodiments of the invention are described below with reference to the following accompanying drawings.

DESCRIPTION OF THE PREFERRED EMBODIMENT

This disclosure of the invention is submitted in furtherance of the constitutional purpose of the U.S. Patent Laws "to promote the progress of science and useful arts" (Article 1, Section 8).

The Applicant directly points out a key point for solving most of disadvantages of fabrication of conventional elevated source-drain MOSFET: diffusion of dopants can be reduced by decreasing both period and temperature of all processed thermal processes. Further, because that both temperature and period of each processed thermal process is limited and arbitrary decrease of temperature will induces unexpected risk, for example dielectric layer can not be properly deposited when temperature too low to let each reactant fully reacts with other reactants, a more effective way is to perform all required thermal processes at the period. Surely, while several thermal processes are performed simultaneously, both temperature and period should be adjusted to satisfy all requirements of all thermal processes.

Further, aims at the problem that fabrication of gate is complexed by inconvenience of fabrication of polycide, the Applicant also points out a key point: MOSFET only requires oxide layer (dielectric layer) is located between substrate and metal layer (conductor layer), it never requires that oxide layer is almost parallel to metal layer, which is a characteristic of most of conventional MOSFET. In other words, by application of concepts of copper damascene, it is possible to avoid troubles of twice etch process of fabrication of polycide by following steps: forms a U-shaped oxide layer, forms metal layer at least on the U-shaped oxide layer, and remove excess metal layer by a planarizating process.

Besides, for MOSFET with elevated source-drain, concepts of copper damascene could be further applied to replace conventional fabrication of MOSFET that gate is formed before source/drain are formed by a new fabrication that gate is formed after source/drain have been formed. Because elevated source-drain are located on top surface of substrate, oxide layer and metal layer (such as polycide layer) could be formed by first deposing them into the hole surrounded by raised source-drain and then removing excess these layers. Without argument, no etch process is required by formation of gate in this way, then not possible only error of photolithography can be avoid but also total fabrication is simplified. Thus, the present way is more suitable for fabricating smaller scale MOSFET than conventional methods.

Figure 1:
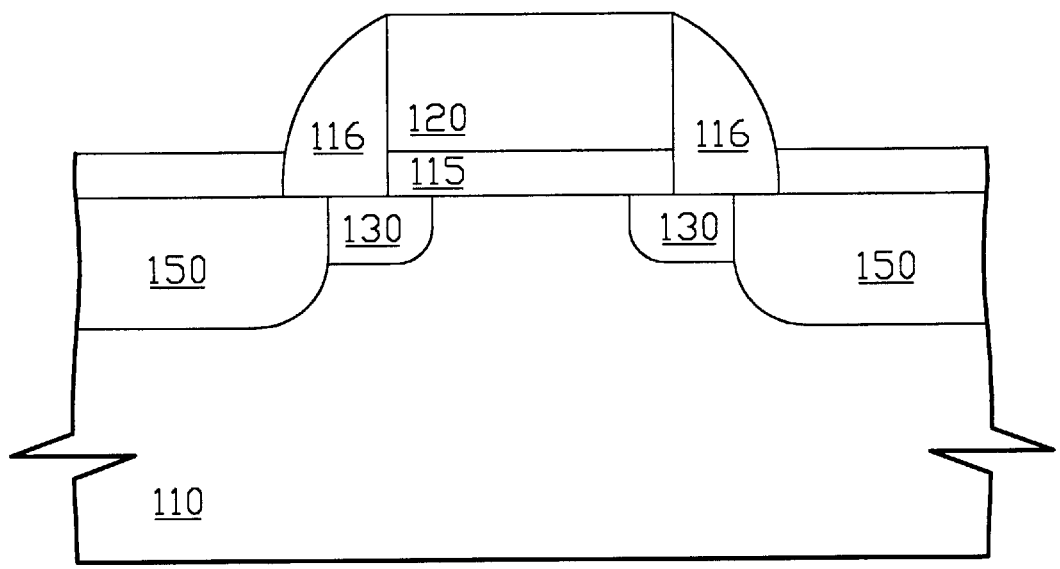
FIG. 1 is a cross-sectional view of a conventional MOSFET.
Figure 2:
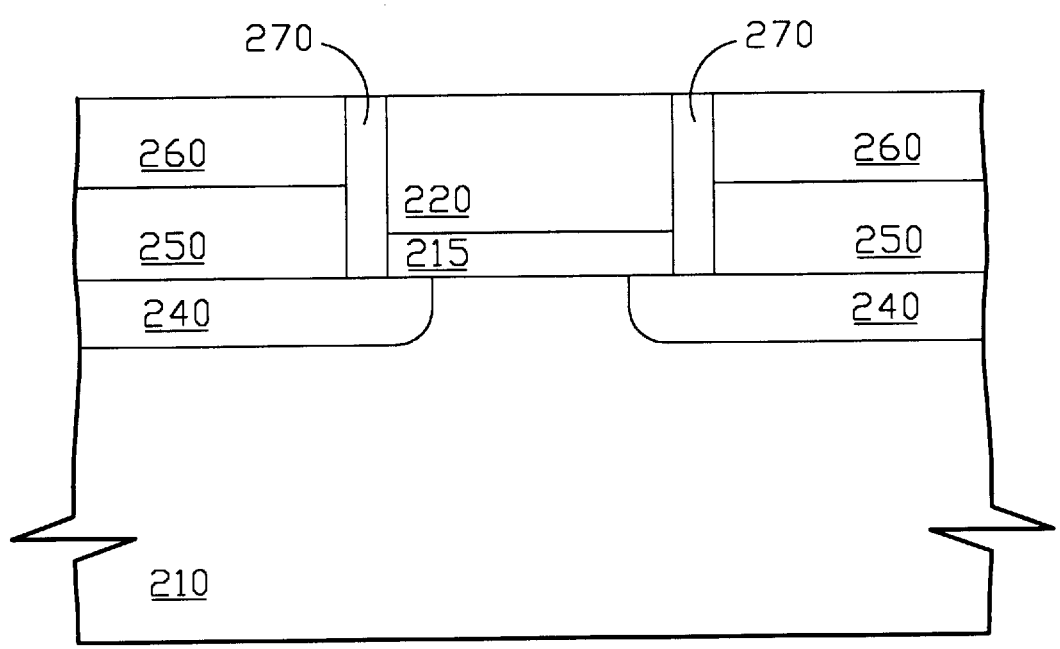
FIG. 2 is a cross-sectional view of a HCS MOSFET.
Figure 3:
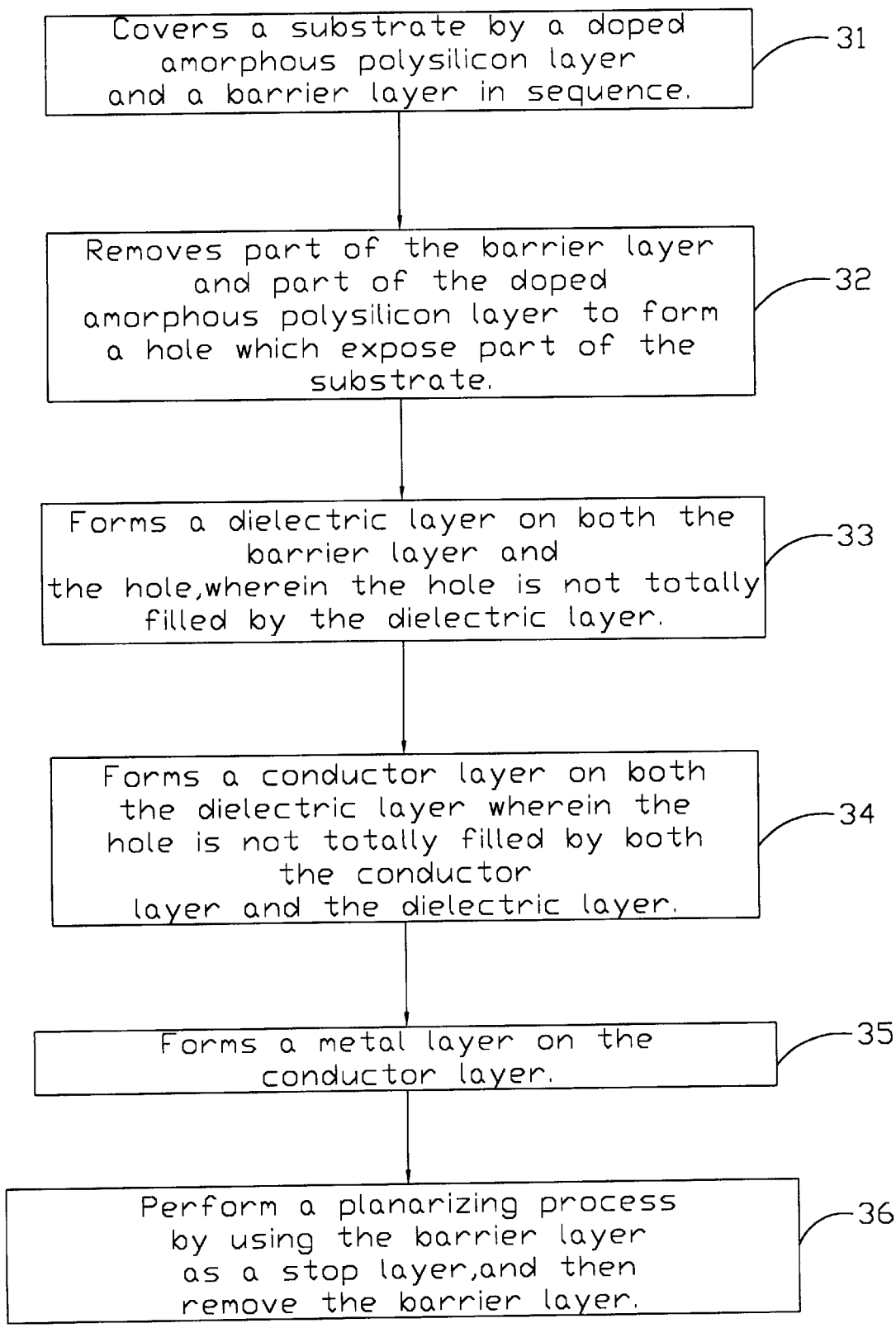
FIG. 3 is a briefly flowchart of a present method of the invention.

In accordance with previous viewpoints, the Applicant presents a method for forming a transistor, especially a transistor with both elevated source-drain and metal gate. As shown in FIG. 3, the method at least includes following steps: as cover block 31 shows, covers a substrate by a doped amorphous polysilicon layer and a barrier layer in sequence; as hole block 32 shows, removes part of the barrier layer and part of the doped amorphous polysilicon layer to form a hole which expose part of the substrate; as first fill block shows, forms a dielectric layer on both the barrier layer and the hole, but the hole is not totally filled by the dielectric layer; as second fill block 34 shows, forms a conductor layer on the dielectric layer, wherein the hole is not totally filled by both the conductor layer and the dielectric layer; as form block 35 shows, forms a metal layer on the conductor layer; and as expose bock 36 shows, performs a planarizing process by using the barrier as a stop layer, and then remove the barrier layer.

Figure 4A:
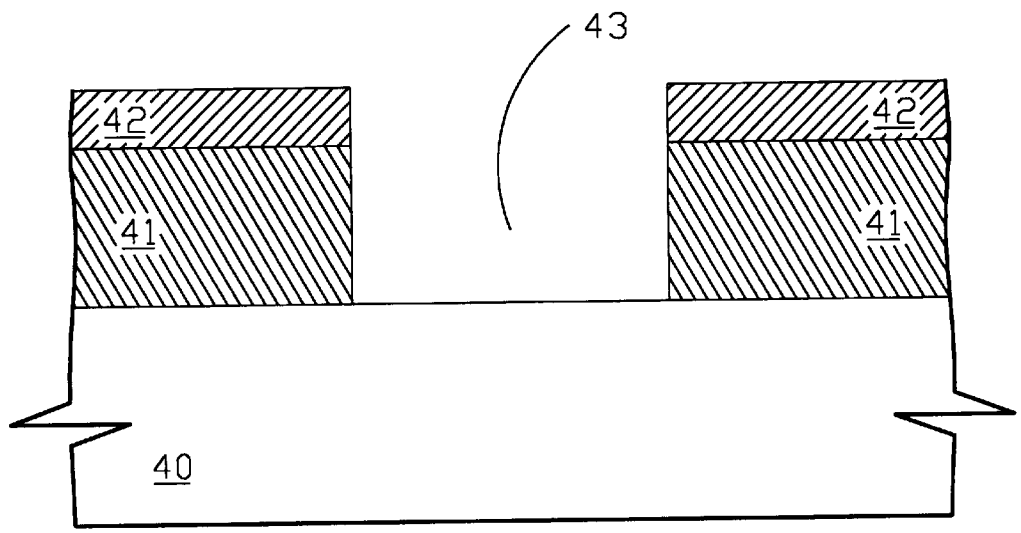
FIG. 4A to FIG. 4F are cross-sectional views of a MOSFET in various steps of fabrication, formed using a method in accordance with one embodiment of the invention.

One preferred embodiment is a method of forming a transistor. In the step shown in FIG. 4A, substrate 40, such as silicon substrate, is provided, and then substrate 40 is covered by doped amorphous polysilicon layer 41 and barrier layer 42 in sequence. Next, part of barrier layer 42 and part of doped amorphous polysilicon layer 41 are removed to form hole 43 which exposes part of substrate 40.

Herein, barrier layer 42 usually is a silicon nitride layer and typical thickness of barrier layer 42 is about from 200 angstroms to 1000 angstroms, and thickness of doped amorphous polysilicon layer 41 usually is about 1000 angstroms to 4000 angstroms.

Figure 4B:
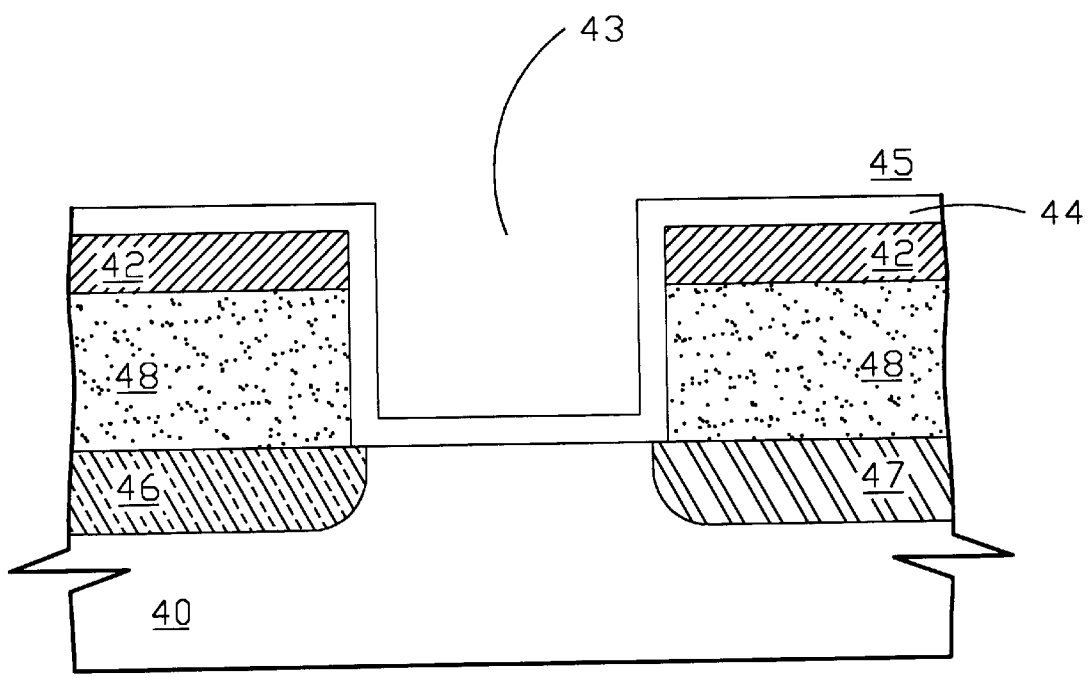

In the step shown in FIG. 4B, dielectric layer 44, which usually is a conformal layer is formed on both barrier layer 42 and hole 43. Whereby, hole 43 is not totally filled by dielectric layer 44. Moreover, dielectric layer 44 can used to form a gate dielectric layer during following processes, and dielectric layer 44 usually is silicon dioxide layer.

It should be emphasized that forming temperature of dielectric layer 44 is high, especially when it is formed by deposition. Then during formation of dielectric layer 44, numerous dopants inside doped amorphous layer 41 are driven into substrate 40 and form both source doped region 46 and drain doped region 47. Further, owing to structure of amorphous is unstable, amorphous polysilicon layer 41 will be recrystallized during formation of said dielectric layer. Then, while both temperature and period of formation of dielectric layer 44 are enough, doped amorphous polysilicon layer 41 will be transformed to be epi-like silicon layer 48. Certainly, forming temperature and forming period of dielectric layer 48 are adjustable to balance requirement of high quality dielectric layer 44, requirement high quality epi-like silicon layer 48 (doped amorphous polysilicon layer 41) and requirement of proper shape of both source doped region 46 and drain doped region 47.

Significantly, because that both source doped region 46 and drain doped region 47 are formed with dielectric layer 44 at the same time, dopants will only diffusive one time. In other words, disadvantages of conventional fabrication of MOSFET that induced by repeated diffusion of dopants can be properly improved.

Figure 4C:
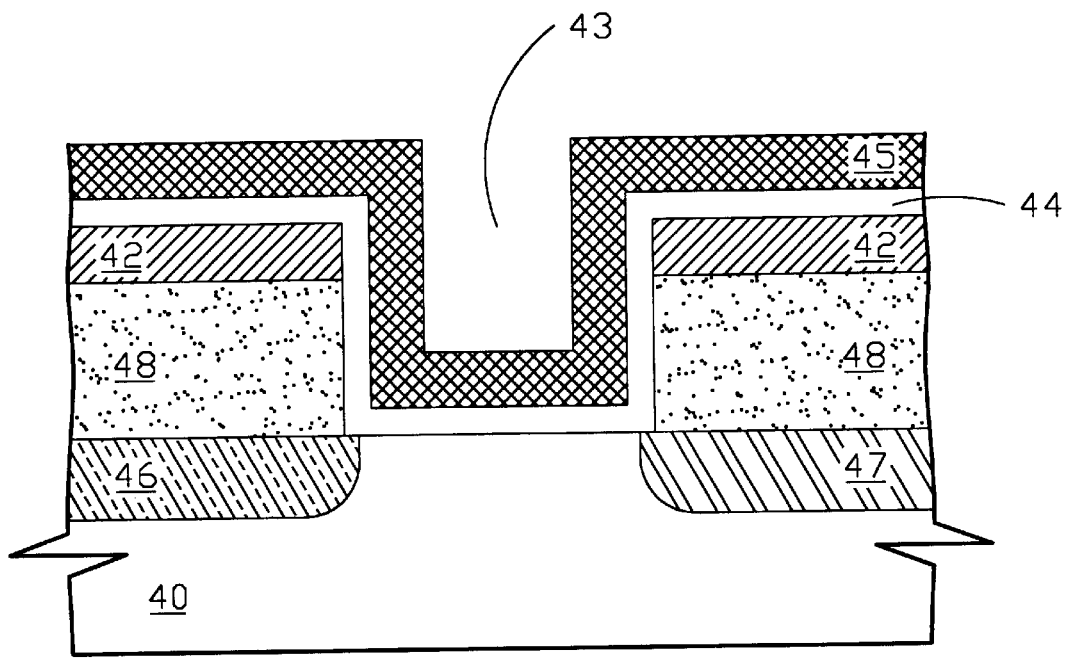

In the step shown in FIG. 4C, conductor layer 45 is formed on dielectric layer 44. Whereby, hole 43 is not totally filled by both dielectric layer 44 and conductor 45, and conductor layer 45 usually is thicker than dielectric layer 44. Besides, conductor layer 45 usually is doped polysilicon layer, and typical thickness of conductor layer 45 is about 300 angstroms to 1000 angstroms.

Figure 4D:
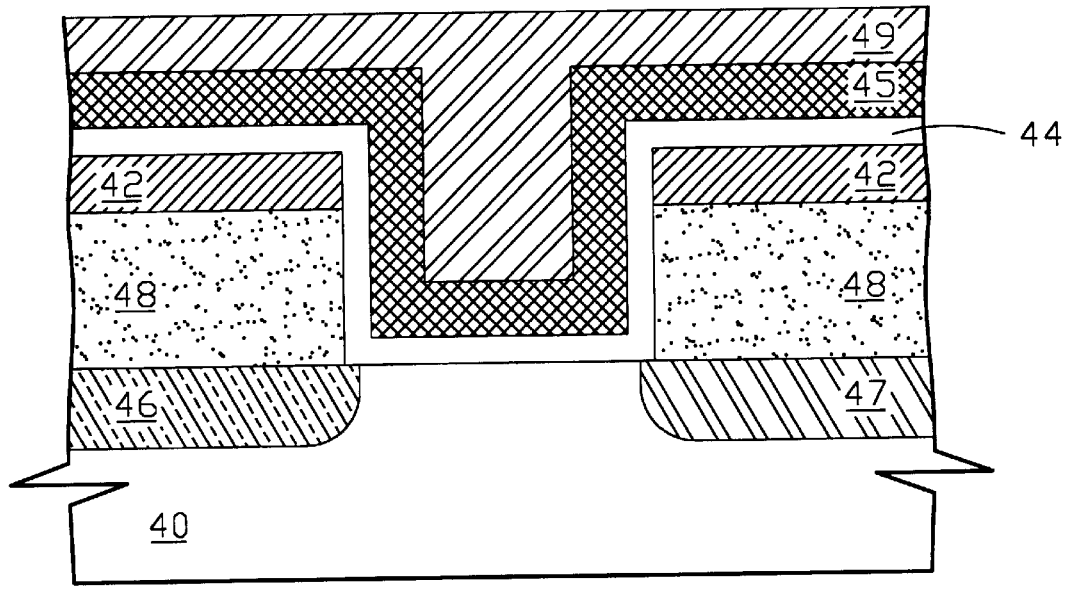

In the step shown in FIG. 4D, metal layer 49 is formed on conductor layer 45. Herein, material of metal layer 49 is chosen from the group of tungsten, aluminum and copper. Certainly, while material of metal layer 49 is refractory metal such as tungsten and cobalt, an optional step is to process a thermal process to let part of metal layer 49 is transformed to a metal silicide layer, which is not shown in these figures.

Figure 4E:
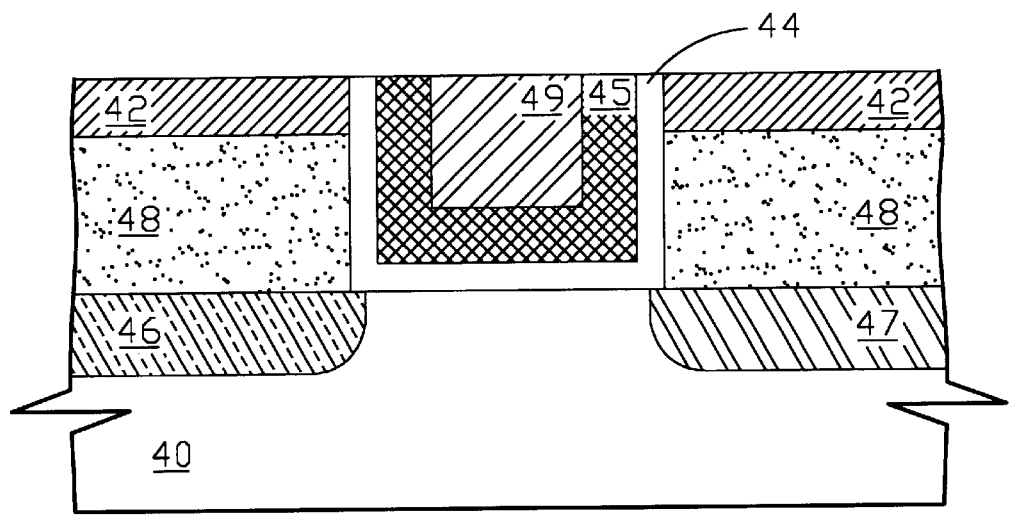

In the step shown in FIG. 4E, a planarizing process, such as chemical mechanical polishing process, is performed by using said barrier layer as a stop layer.

Figure 4F:
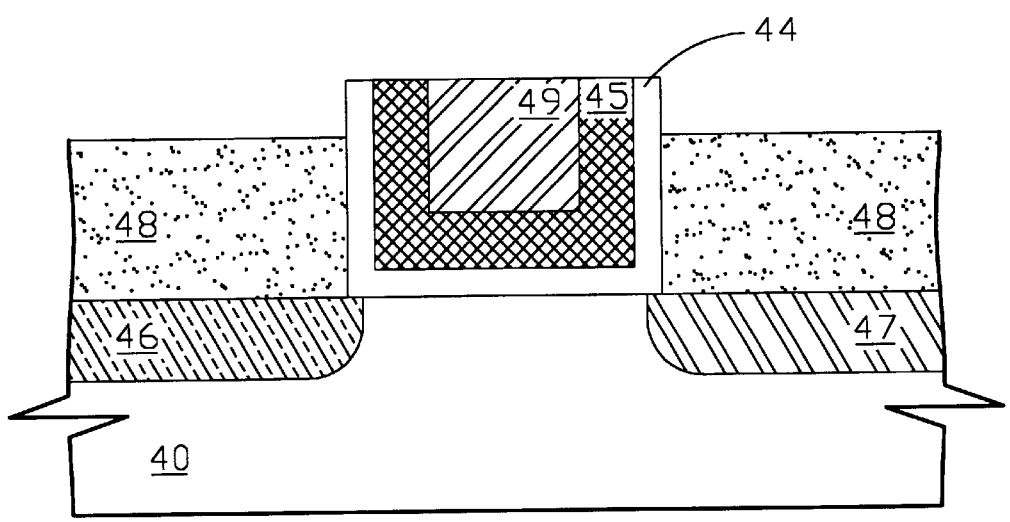

Surely, an optional step is to remove barrier layer 42, as shown in FIG. 4F. Whereby $H_2SO_4$ is used to remove barrier layer 42 while barrier layer 42 is a silicon nitride layer.

Figure 5A:
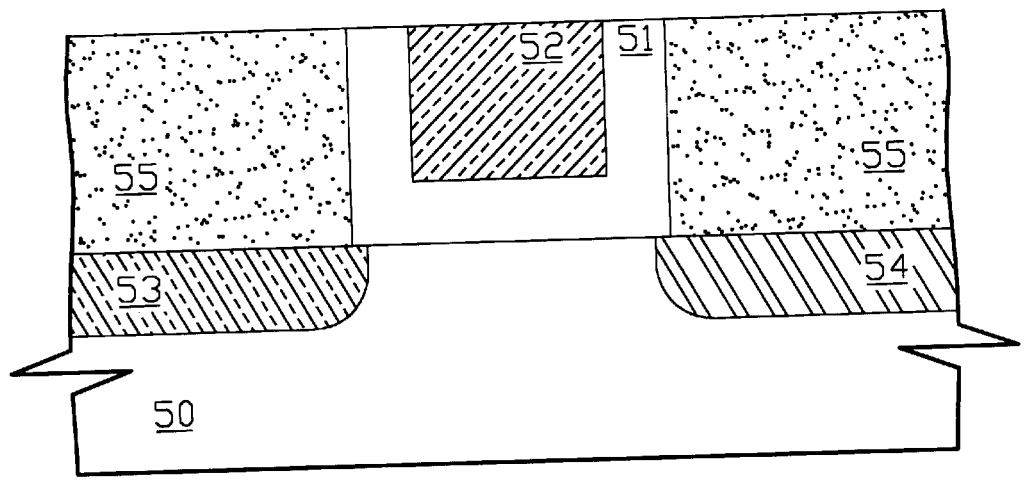
FIG. 5A and FIG. 5B are two cross-section view of a MOSFET in accordance with another embodiment of the invention.

Another preferred embodiment is a semiconductor-metal-oxide transistor. As FIG. 5a shows, at least includes: U-shaped dielectric layer 51, polycide layer 52, source doped region 53, drain doped region 54 and epi-like silicon layer 55.

U-shaped dielectric layer 51 is located on substrate 50, and polycide layer 52 is located on the hollow of U-shaped dielectric layer 51. Source doped region 53 is located in substrate 50 and is briefly located on one side of U-shaped dielectric layer 51, and drain doped region 54 is located in substrate 50 and is briefly located on another side of U-shaped dielectric layer 51. Further, epi-like silicon layer 55 is located on both source doped region 53 and said drain doped region 54. Moreover, material of U-shaped dielectric layer 51 usually is silicon dioxide or silicon nitride, and epi-like silicon layer 55 can be replaced by polysilicon layer.

Without argument, one main characteristic of the invention is that oxide layer (dielectric layer) of gate is not briefly parallel to metal layer (conductor) of gate, but oxide layer is located under and on sidewall of oxide layer. Thus, epi-like silicon 55 and polycide layer 52 can be properly separated by U-shaped dielectric layer 51. And then U-shaped dielectric layer 51 can be used as both spacer and gate dielectric layer.

Figure 5B:
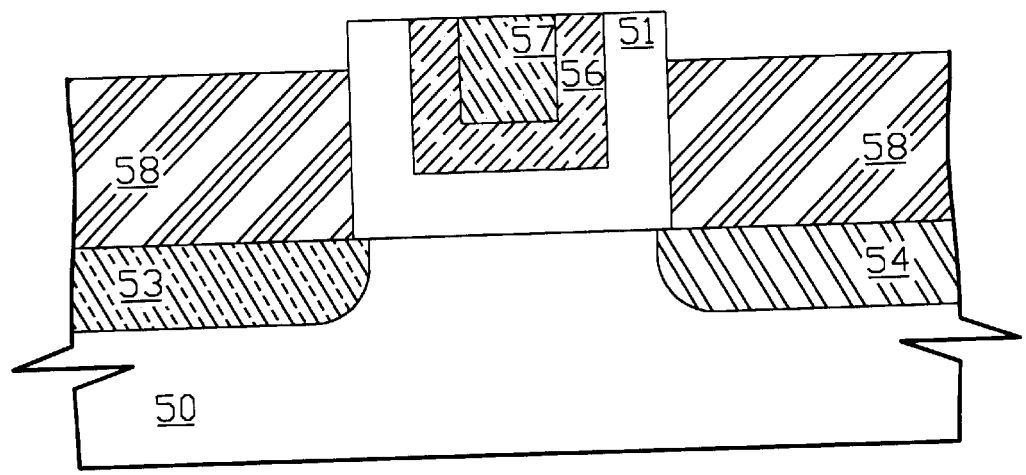

FIG. 5B shows another MOSFET, which present by the Applicant and is similar to FIG. 5A, herein same label indicates same items. As shown in FIG. 5B, polycide layer 52 is replaced by both U-shaped polysilicon layer 56 and metal layer 57, where metal layer 57 is located on the hollow of U-shaped polysilicon layer 56 and U-shaped polysilicon layer 56 is located on the hollow of U-shaped dielectric layer 51. Further, not only material of U-shaped polysilicon layer 56 usually is doped polysilicon but also epi-like silicon layer 55 is replaced by silicon layer 58. Where, wherein available varieties of silicon layer 58 at least include epi-like silicon layer, doped polysilicon layer, amorphous polysilicon layer and doped amorphous polysilicon layer.

Significantly, metal layer 57 can effectively reduce resistance between gate of MOSFET and corresponding conductor line(s), and U-shaped polysilicon layer 56 can be used to let metal layer 57 is formed by deposition, which can avoid troubles of etch metal layer 57 in conventional fabrication. In general, available materials of metal layer 57 at least include copper, tungsten and aluminum. Further, while silicon layer 58 and metal layer 57 have been properly insulated from each other, height of U-shaped dielectric layer 51 can be different from thickness of silicon layer 58.

Although specific embodiments have been illustrated and described, it will be obvious to those skilled in the art that various modifications may be made without departing from what is intended to be limited solely by the appended claims.

What is claimed is:

1. A method of forming a transistor, comprising:

providing a substrate;

covering said substrate by a doped amorphous polysilicon layer and a barrier layer in sequence, and removing part of said barrier layer and part of said doped amorphous polysilicon layer in sequence to form a hole which exposes part of said substrate, wherein said hole is corresponding to a location of a gate of said transistor;

forming a dielectric layer on both said barrier layer and said hole, said hole being not totally filled by said dielectric layer, wherein said dielectric layer can be used to form a gate dielectric layer of said transistor;

forming a conductor layer on both said dielectric layer, wherein said hole is not totally filled by both said conductor layer and said dielectric layer;

forming a metal layer on said conductor layer;

performing a planarizing process by using said barrier layer as a stop layer; and removing said barrier layer.

2. The method of claim 1, wherein said barrier layer is a silicon nitride layer.

3. The method of claim 1, wherein thickness of said barrier layer is about from 200 angstroms to 1000 angstroms.

4. The method of claim 1, wherein thickness of said doped amorphous polysilicon layer is about 1000 angstroms to 4000 angstroms.

5. The method of claim 1, wherein a plurality of dopants inside said doped amorphous layer are driven into said substrate during formation of said dielectric layer.

6. The method of claim 1, wherein said doped amorphous polysilicon layer is re-crystallized to form an epi-like silicon layer during formation of said dielectric layer.

7. The method of claim 1, wherein said dielectric layer is a conformal layer.

8. The method of claim 1, wherein said conductor layer is a doped polysilicon layer.

9. The method of claim 1, wherein thickness of said conductor layer is about form 300 angstroms to 1000 angstroms.

10. The method of claim 1, wherein material of metal layer is chosen from the group of tungsten, aluminum and copper.

11. The method of claim 1, further comprises performing a thermal process to transfer part of said metal layer to a metal silicide layer.

12. The method of claim 1, wherein said planarizing process is a chemical mechanical polishing process.

13. The method of claim 1, wherein $H_2SO_4$ is used to remove said barrier layer while said barrier layer is a silicon nitride layer.

* * * * *